(12) United States Patent
Bera et al.

(10) Patent No.: US 11,031,530 B2
(45) Date of Patent: *Jun. 8, 2021

(54) LIGHT EMITTING DEVICE WITH NANOSTRUCTURED PHOSPHOR

(71) Applicant: LUMILEDS LLC, San Jose, CA (US)

(72) Inventors: Debasis Bera, San Jose, CA (US); Mark Melvin Butterworth, Santa Clara, CA (US); Oleg Borisovich Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 16/504,153

(22) Filed: Jul. 5, 2019

(65) Prior Publication Data

US 2019/0326483 A1 Oct. 24, 2019

Related U.S. Application Data

(63) Continuation of application No. 15/441,176, filed on Feb. 23, 2017, now Pat. No. 10,347,800, which is a
(Continued)

(51) Int. Cl.
*H01L 33/50* (2010.01)
*H01L 33/64* (2010.01)
(Continued)

(52) U.S. Cl.
CPC .......... *H01L 33/504* (2013.01); *H01L 33/483* (2013.01); *H01L 33/507* (2013.01);
(Continued)

(58) Field of Classification Search
CPC ... H01L 33/64; H01L 33/483; H01S 5/02228; H01S 5/02244
See application file for complete search history.

(56) References Cited

U.S. PATENT DOCUMENTS 7,385,349 B2 6/2008 Daicho et al.
7,889,421 B2 2/2011 Nerendran et al.
(Continued)

FOREIGN PATENT DOCUMENTS

CN 1755958 A 4/2006
CN 102280565 A 12/2011
(Continued)

OTHER PUBLICATIONS

Japanese Office Action dated Mar. 20, 2018, JP application No. 2015-512153, 6 pages.
(Continued)

*Primary Examiner* — Tuan N Nguyen

(57) ABSTRACT

Embodiments of the invention include a light emitting device, a first wavelength converting material, and a second wavelength converting material. The first wavelength converting material includes a nanostructured wavelength converting material. The nanostructured wavelength converting material includes particles having at least one dimension that is no more than 100 nm in length. The first wavelength converting material is spaced apart from the light emitting device.

13 Claims, 3 Drawing Sheets

Related U.S. Application Data continuation of application No. 14/398,764, filed as application No. PCT/IB2013/053491 on May 2, 2013, now Pat. No. 9,634,201.

(60) Provisional application No. 61/646,495, filed on May 14, 2012.

(51) Int. Cl.
  H01L 33/48 (2010.01)
  H01L 33/60 (2010.01)
  H01L 33/46 (2010.01)

(52) U.S. Cl.
  CPC ............ H01L 33/508 (2013.01); H01L 33/60 (2013.01); H01L 33/64 (2013.01); *H01L 33/46* (2013.01); *H01L 33/502* (2013.01); *H01L 33/644* (2013.01); *H01L 2924/0002* (2013.01)

(56) References Cited

U.S. PATENT DOCUMENTS

| | | | |
|---|---|---|---|
| 8,294,165 | B2 | 10/2012 | Hattori et al. |
| 8,294,357 | B2 * | 10/2012 | Washizu ............ C09K 11/7774 |
| | | | 313/501 |
| 8,324,641 | B2 | 12/2012 | Yan et al. |
| 8,562,161 | B2 | 10/2013 | Tong et al. |
| 9,093,623 | B2 | 7/2015 | Petry et al. |
| 2004/0150991 | A1 | 8/2004 | Ouderkirk et al. |
| 2004/0150997 | A1 * | 8/2004 | Ouderkirk ............ H01L 33/505 |
| | | | 362/255 |
| 2006/0066210 | A1 | 3/2006 | Ng et al. |
| 2007/0096128 | A1 | 5/2007 | Fukudome |
| 2007/0182299 | A1 * | 8/2007 | Ouderkirk ............ H01L 33/507 |
| | | | 313/110 |
| 2008/0173889 | A1 * | 7/2008 | Shylo ............ H01L 33/44 |
| | | | 257/98 |
| 2009/0213296 | A1 | 8/2009 | Park et al. |
| 2009/0256166 | A1 | 10/2009 | Koike et al. |
| 2009/0322205 | A1 | 12/2009 | Lowery |
| 2010/0005189 | A1 | 3/2010 | Kim et al. |
| 2010/0103648 | A1 | 4/2010 | Kim et al. |
| 2010/0110728 | A1 | 5/2010 | Dubrow et al. |
| 2011/0044026 | A1 | 2/2011 | Deeben et al. |
| 2011/0089815 | A1 | 4/2011 | Yeh et al. |
| 2011/0127555 | A1 | 6/2011 | Rains, Jr. et al. |
| 2011/0127557 | A1 | 6/2011 | Ramer et al. |
| 2011/0303940 | A1 | 12/2011 | Lee et al. |
| 2011/0309390 | A1 | 12/2011 | Liu et al. |
| 2011/0317397 | A1 | 12/2011 | Trottier et al. |
| 2012/0104437 | A1 | 5/2012 | Weber |

FOREIGN PATENT DOCUMENTS

| | | |
|---|---|---|
| EP | 1589591 A2 | 10/2005 |
| JP | 2005125764 A | 5/2005 |
| JP | 2005197476 A | 7/2005 |
| JP | 2005311170 A | 11/2005 |
| JP | 2006108661 A | 4/2006 |
| JP | 2006186022 A | 7/2006 |
| JP | 2006517346 A | 7/2006 |
| JP | 2007173754 A | 7/2007 |
| JP | 2008283180 A | 11/2008 |
| JP | 2010510654 A | 4/2010 |
| JP | 2010528118 A | 8/2010 |
| JP | 2010219212 A | 9/2010 |
| JP | 2010258469 A | 11/2010 |
| JP | 2011107508 A | 6/2011 |
| JP | 2011198800 A | 10/2011 |
| JP | 2012004567 A | 1/2012 |
| KR | 10-2006-0114523 A | 11/2006 |
| KR | 10-0982991 B1 | 9/2010 |
| TW | 201011213 A | 3/2010 |
| TW | 201142214 A | 12/2011 |
| TW | M427646 U | 4/2012 |
| WO | 2011/0004795 A1 | 1/2011 |
| WO | 2011079900 A1 | 7/2011 |
| WO | 20110092647 A2 | 8/2011 |
| WO | 2012/135744 A2 | 10/2012 |
| WO | WO 2012-135744 * 10/2012 ............ H01L 33/50 |
| WO | 2013171610 A1 | 11/2013 |

OTHER PUBLICATIONS

Third Office Action dated Mar. 19, 2018, CN application No. 201380025286.2, 17 pages.

SIPO Second Office Action dated Jun. 29, 2107, CN application No. 201380025236.2, 17 pages.

Office Action dated Aug. 30, 2017, TW application No. 106122133, 7 pages.

Notice of Reason for Rejection dated Oct. 3, 2017, JP application No. 2015-512153, 6 pages.

CN Office Action, Application 201380025286.2, Applicant reference 2011P01118WOCN, dated Oct. 18, 2016, 12 pages.

TW Office Action, Application 102117087, Applicant reference 2011P01118WOTW, dated Oct. 18, 2016, 12 pages.

PCT/IB2013/053491, International Search Report and Written Opinion, 14 pages.

JP Office Action, Application 2015-512153, Applicant reference 2011P01118WOJP, dated Feb. 7, 2017, 13 pages.

* cited by examiner

LIGHT EMITTING DEVICE WITH NANOSTRUCTURED PHOSPHOR

CROSS-REFERENCE TO PRIOR APPLICATIONS

This application is a continuation of U.S. patent application Ser. No. 15/441,176, filed Feb. 23, 2017, which is a continuation of U.S. patent application Ser. No. 14/398,764, filed Nov. 4, 2014, which is the U.S. National Phase application under 35 U.S.C. 371 of International Application No. PCT/IB2013/053491, filed May 2, 2013, which claims the benefit of U.S. Patent Application No. 61/646,495, filed on May 14, 2012. U.S. patent application Ser. No. 15/441,176, U.S. patent application Ser. No. 14/398,764, International Application No. PCT/IB2013/053491, and U.S. Patent Application No. 61/646,495 are hereby incorporated herein by reference in their entirety.

FIELD OF THE INVENTION

The present invention relates to a semiconductor light emitting device such as a light emitting diode combined with a nanostructured phosphor.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices may be combined with wavelength converting materials such as phosphors, as is known in the art, to form white light or light of other colors. Wavelength converting materials absorb light emitted by the light emitting region of the III-nitride device and emit light of a different, longer wavelength. Wavelength-converted III-nitride devices may be used for many applications such as general illumination, backlights for displays, automotive lighting, and camera or other flashes.

SUMMARY

It is an object of the invention to provide an efficient wavelength converted light emitting device.

Embodiments of the invention include a light emitting device, a first wavelength converting material, and a second wavelength converting material. The first wavelength converting material includes a nanostructured wavelength converting material. The nanostructured wavelength converting material includes particles having at least one dimension that is no more than 100 nm in length. The first wavelength converting material is spaced apart from the light emitting device.

DETAILED DESCRIPTION

As used herein, "pump light" refers to light that is emitted by a semiconductor light emitting device such as an LED. "Converted light" refers to pump light that is absorbed by a wavelength converting material and reemitted at a different wavelength.

The efficiency of a light source such as an LED combined with one or more wavelength converting materials may be less than optimal for at least two reasons.

Figure 1:
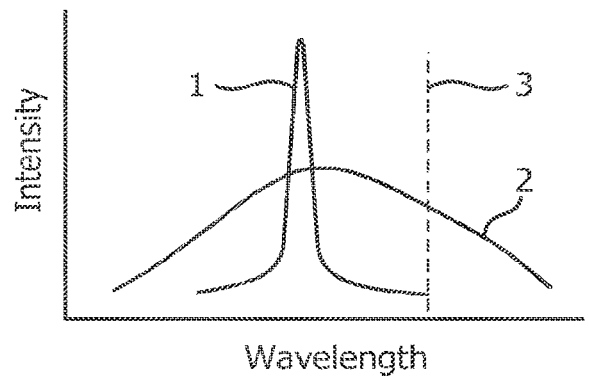
FIG. 1 illustrates intensity as a function of wavelength for a red-emitting phosphor and a red-emitting nanostructured phosphor.

First, devices that emit white light often include a wavelength converting material such as phosphor that emits red light. Some red-emitting phosphors emit at least some light at wavelengths outside human eye-response curve. This light is effectively lost for most applications. In addition, the gamut for the human eye-response curve ranges from about 380 nm to about 780 nm with a peak maximum at 555 nm. The human eye has different sensitivity at different wavelengths. For example, the human eye can detect a flux of just 10 photons/s at a wavelength of 555 nm but requires 214 photons/s at 450 nm and 126 photons/s at 650 nm. Since the human eye is not very sensitive to red (650 nm) light, it is desirable for the red-emitting wavelength converting material to emit light in a very narrow wavelength band. This desirable red-emitting wavelength converting material behavior is illustrated by peak 1 on FIG. 1, which is a plot of emission strength as a function of wavelength for a red-emitting phosphor. Peak 1 is a steep, narrow peak that is entirely within the human eye-response curve, indicated by dashed line 3 in FIG. 1. Many common red-emitting wavelength converting materials exhibit the less efficient behavior illustrated by peak 2 in FIG. 1. These materials emit light over a broader wavelength range.

Second, wavelength converting materials that introduce too much scattering can reduce the efficiency of the device.

In embodiments of the invention, a wavelength-converted semiconductor device such as an LED includes a nanostructured light-emitting material that absorbs pump light and emits converted light. Nanostructured materials are nanometer-sized semiconductor particles of various shapes such as, for example, rods, cones, spheres, tubes, or any other suitable shape, that are nanometer length scale in at least one dimension. Quantum wells are particles that are nanometer length in scale in one dimension; quantum wires are particles that are nanometer length in scale in two dimensions, and quantum dots are particles that are nanometer length in scale in all 3 dimensions. Nanostructured materials may have a surface area to volume ratio of at least $6 \times 10^5$ cm$^{-1}$ in some embodiments and no more than $1.5 \times 10^7$ cm$^{-1}$ in some embodiments. In some embodiments, at least one dimension of the nanostructured material is shorter than the nanostructured material's electron wavefunction or Bohr atomic radius. This modifies a bulk property such as the semiconductor band gap into a mesoscopic or quantum property which now changes with the length in the relevant dimension of the nanostructured material. The nanostructured material may be, in some embodiments, a red-emitting nanostructured phosphor or a nanostructured phosphor emitting light of a different color. Nanostructured phosphors may be referred to herein as "quantum dots" or "Qdots". Examples of suitable materials include CdSe, CdS, InP, InAs, CdTe, HgTe, ZnS, ZnSe, CuInS$_2$, CuInSe$_2$, Si, Ge, and any semiconductor material with a band gap close to that of visible light, i.e. with a band gap no more than 2.0 eV in some embodiments. The nanostructured material may be, in some embodiments, a light-emitting nanostructured material doped with transition metal ions and/or rare earth metal ions can also emit suitable red light in a narrow wavelength range. These materials may be referred to herein as "doped dots" or "Ddots". Examples of suitable materials include any of the above-listed quantum dot materials including dopants, Cu-doped ZnSe, Mn-doped ZnSe, Cu-doped CdS, and Mn-doped CdS.

The nanostructured material particles may have an average diameter of at least 2 nm in some embodiments, no more than 20 nm in some embodiments, no more than 50 nm in some embodiments, and no more than 100 nm in some embodiments. In some embodiments, the particles of nanostructured material have a size distribution of at least 5% in some embodiments and over 30% in some embodiments. For example, the diameters of particles may vary between +/−5% of the average diameter in some embodiments and between +/−30% of the average diameter in some embodiments. In contrast, conventional powder phosphors often have a particle size of 1 µm or more. A majority of phosphor particles, for example greater than 99% of phosphor particles, have a diameter larger than 20 nm. In addition, in a nanostructured material, the optical properties such as absorption and emission wavelength may vary with the particle size. In a powder phosphor, two particles of the same material with different sizes typically have the same absorption and emission wavelength.

Nanostructured material particles such as quantum dots are typically attached to a ligand that facilitates processing (for example, without the ligand, the particles may fuse to each other to form a large mass). The ligand may be any suitable material. Examples of suitable ligands include carboxylic acid and phosphine functionalized alkane based molecules such as oleic acid or tri-octyl phosphine.

In some embodiments, the nanostructured material emits light in a narrow wavelength band. For example, a nanostructured material may have a full-width-half-maximum of at least 20 nm in some embodiments and no more than 60 nm in some embodiments. The peak wavelength emitted by a red-emitting nanostructured phosphor may be tuned by selecting the composition and/or size of the particles. The tunability of nanostructured materials may be due to the quantum confinement of the excitons inside the particles. Nanostructured materials exhibit little or no scattering of visible light.

The use of nanostructured materials presents design challenges. First, due to high surface area-to-volume ratio of nanostructured materials, the structural and chemical properties of these materials may change in the presence of oxygen and moisture. Such changes may undesirably alter the optical properties of the nanostructured materials.

Second, the optical properties, such as absorption and emission characteristics, may be degraded by increases in temperature. For example, the peak wavelength emitted by nanostructured wavelength converting materials may undesirably shift with an increase in temperature due to intrinsic properties of the nanostructured wavelength converting material. In addition, the peak intensity emitted by nanostructured wavelength converting materials may decrease with temperature. State-of-the-art high-brightness LEDs generate heat during transformation of electrical energy to photon energy. For example, the junction temperature of current high brightness LEDs may be approximately 85° C. when driven at 350 mA of current. Such temperature can affect the optical performance of nanostructured materials if the nanostructured materials are directly attached to the LED.

In embodiments of the invention, a device including an LED and a nanostructured wavelength converting material is packaged to efficiently remove heat from the nanostructured wavelength converting material and to protect the nanostructured material from oxygen and moisture. The following figures illustrate embodiments of the invention.

As a preliminary matter, one or more semiconductor devices such as LEDs are provided. Any suitable III-nitride LED may be used and such LEDs are well known. Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

LED 10 in the following figures may be, for example, a flip chip device configured to emit a majority of light from the top surface of the LED. To form such an LED, a III-nitride semiconductor structure is first grown on a growth substrate, as is known in the art. The growth substrate may be any suitable substrate such as, for example, sapphire, SiC, Si, GaN, or composite substrates. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 μm in some embodiments and less than 6 μm in some embodiments.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art.

The semiconductor structure may be connected to a support through the p- and n-contacts. The support is a structure that mechanically supports the semiconductor structure. The support is a self-supporting structure suitable to attach to a structure on which LED 10 is mounted. For example, the support may be reflow-solderable. Any suitable support may be used. Examples of suitable supports include an insulating or semi-insulating wafer with conductive vias for forming electrical connections to the semiconductor structure, such as a silicon wafer, thick metal bonding pads formed on the semiconductor structure, for example by plating, or a ceramic, metal, or any other suitable mount. The growth substrate may be removed, or it may remain part of the device. The semiconductor structure exposed by removing the growth substrate may be roughened, patterned, or textured to increase light extraction.

Nanostructured wavelength converting layer 12 in the following figures includes a light-emitting material, such as the Qdots or Ddots described above, and a matrix material in which the nanostructured light-emitting material is disposed. The nanostructured light-emitting material may be randomly or orderly arranged Qdots or Ddots in the matrix. The nanostructured wavelength converting material particles can be either bonded (covalent or ionic or coordination) to the matrix or mechanically or physically trapped in the matrix. In some embodiments, the particles of nanostructured wavelength converting material are formed into close-packed or ordered films, where neighboring particles physically contact one another. Ordered films of nanostructured particles can be self-assembled by, for example, suspending the particles in a solvent then allowing the particles to settle into an ordered film as the solvent dries. Alternatively, ordered films of nanostructured particles can be formed by floating the nanostrutured particles on a liquid surface that is not miscible with the particles. As the particles float, they can be physically pushed together and then transferred as an ordered array on to a substrate, which can then be used in one of the arrangements described below.

In some embodiments, close proximity of one particle to another is undesirable because neighboring particles may quench each other's fluorescence properties or change the peak emission wavelength. For example, the closer the spacing between neighboring particles, the more red-shifted the emission wavelength becomes. The spacing between neighboring particles may be at least 5 nm in some embodiments, at least 10 nm in some embodiments, at least 20 nm in some embodiments, no more than 100 nm in some embodiments, no more than 500 nm in some embodiments, and no more than 1 μm in some embodiments.

In some embodiments, the nanostructured material particles are coated with a shell that repels other particles of nanostructured material. In some embodiments, the matrix is selected to provide adequate separation of neighboring particles in a miscible fashion (i.e. separation with no aggregation or clustering of the nanostructured particles). In some embodiments, matrix materials that cause aggregation of nanostructured particles during film formation or operation of the device are avoided. In some embodiments, matrix materials that maintain their shape during operation of the device, that are optically and chemically stable with respect to temperature, blue flux, and nanostructured particle ionization are used. (Ionization refers to the nanostructured materials emitting electrons from nanostructured particle surfaces.)

Examples of suitable matrix materials include, for example, air or dielectric materials (polymer or ceramic), organic materials (such as polyethylene (HDPE, LDPE), polypropylene, polyvinyl halide, polystyrene, polyvinylidene halide, polyalkyl methacrylate, poly tetrafluoro ethylene, polychloro fluoro ethylene, polyamide 6, polyamide 66, polyimide, polyamide-imide, polyurethane, polycarbonate, polyacetal, polyethylene terephthalate, cellulose acetate butyrate, cellulose nitrate, acrylonirile-butadiene-styrene polyvinyl formal, silicone, polysulfone, thermanox, thermoplastic elastomer, polymethyl pentene, parylene or crosslinked polymers or inorganic materials (such as sol-gel based silica, titania, zirconia or combination of these and glass ceramics), or composites. Composites include mixtures of materials that are optimized for particular properties. For example, glass beads may be mixed with a polymer to form a mixture with increased viscosity as compared to the polymer alone. In another example, silicone may be mixed with an organic polymer to form a mixture with desired solubility. In some embodiments, inorganic materials are mixed with organic or silicone materials to form materials with desired properties such as glass transition temperature, refractive index, and melting point.

Composites can be combinations of dielectric materials and/or metallic materials including particulate materials that are nanometer scale in at least one, two, or three dimensions. For example, clay nanoparticle/polymer, metal nanoparticle/polymer, and carbon nanotube/polymer nanocomposites may be suitable. Suitable nanocomposites are commercially available. For example, nylon nanocomposites, polyolefin nanocomposites, M9 (Mitsubishi), Durethan KU2-2601 (Bayer), Aegis NC (Honeywell), Aegis™ Ox (low oxygen transmission rate—Honeywell), or Forte nanocomposites (Noble) and combinations of the above-described materials can be used. Nanoclay nanocomposites such as nanomers (Nanocor), closite (Southern Clay products), Bentone (Elementis), Polymer-pellet (PolyOne, Clariant, RTP), Nanofil (Sud-Chemie), Planomers (TNO), Planocolors (TNO), PlanoCoatings (TNO) can be used alone or in combination with other materials. For example, PlanoCoatings, which may provide excellent transparency and barrier properties, may be combined with Planomers, which may provide thermal stability. Composites with combinations of polymer/s and nanomaterials from Suncolor Corporation (HTLT1070 or HTLT1070AA) provide excellent transparency in visible wavelength (380 nm-780 nm) and high glass-transition temperature.

In one example, the nanostructured wavelength converting material includes CdSe quantum dots disposed in a shell of CdZnS. The matrix is aliphatic acrylate or silicone. The nanostructured wavelength converting layer 12 is 100 µm thick. Nearest neighbor nanostructured particles are spaced at least 5 nm apart and no more than 200 nm apart. The nanostructured wavelength converting layer 12 may be formed by mixing CdSe/CdZnS core-shell material with the matrix material to form a viscous film that is blade-coated, drop-cast, or otherwise dispensed on a substrate.

In the examples illustrated in FIGS. 2, 4, 5, 6, and 7, a nanostructured wavelength converting layer is spaced apart from an LED 10. A second wavelength converting layer, which is often not a nanostructured wavelength converting layer and may be, for example, a powder or ceramic phosphor layer, may be disposed between LED 10 and the nanostructured wavelength converting layer 12.

Figure 2:
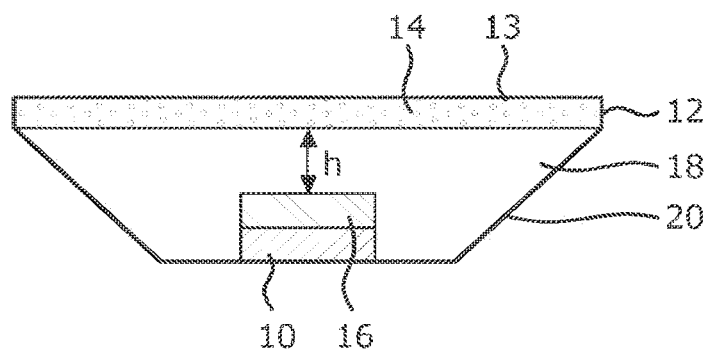
FIG. 2 illustrates a structure including an LED, a wavelength converting layer, and a nanostructured wavelength converting material that is spaced apart from the LED.

FIG. 2 illustrates an example of a device including a nanostructured wavelength converting layer. A wavelength converting layer 16 is formed over the top surface of LED 10, in close proximity to LED 10. Wavelength converting layer 16 may be one or more conventional phosphors, organic phosphors, organic semiconductors, II-VI or III-V semiconductors, dyes, polymers, or other materials that luminesce. Any suitable phosphor may be used, including but not limited to garnet-based phosphors, $Y_3Al_5O_{12}$:Ce, $Lu_3Al_5O_{12}$:Ce, $Y_3Al_{5-x}Ga_xO_{12}$:Ce, $(Ba_{1-x}Sr_x)SiO_3$:Eu (BOSE), nitride-based phosphors, $(Ca,Sr)AlSiN_3$:Eu, and $(Ca,Sr,Ba)_2Si_5N_8$:Eu. Wavelength converting layer 16 may include a single wavelength converting material or multiple wavelength converting materials which may be mixed together or disposed on the top of LED 10 in separate layers. Wavelength converting layer 16 may be, for example, a powder phosphor layer formed by electrophoretic deposition, dyes or powder phosphors mixed with transparent binder material such as silicone or epoxy that are molded, screen printed, spray coated, or injected over LED 10, or prefabricated wavelength converting layers such as ceramic phosphors or phosphors or dyes embedded in glass, silicone, or other transparent materials. The thickness of wavelength converting layer 16 depends on the materials used and the deposition technique. Wavelength converting layer 16 may be at least 20 µm thick in some embodiments and no more than 500 µm thick in some embodiments.

LED 10 and wavelength converting layer 16 are positioned in the bottom of a reflective container 20. Reflective container 20 can be rectangular, round, conical, or any other suitable shape. Reflective container 20 may be formed, for example, of polymer, metals, ceramics, dielectric materials, combinations of materials, or any other suitable material. In some embodiments, reflective container 20 is formed from or includes at least one thermally conductive material to conduct heat away from the structures within reflective container 20. In some embodiments, reflective container 20 is configured as or thermally connected to a heat sink. Though FIG. 2 illustrates one LED 10 disposed in reflective container 20, in some embodiments multiple LEDs 10 are disposed in a single reflective container.

A nanostructured wavelength converting layer 12 is spaced apart from LED 10 and wavelength converting layer 16, for example across a top opening in reflective container 20. A spacing h between the top of wavelength converting layer 16 (or the top of LED 10) and the bottom of nanostructured wavelength converting layer 12 may be at least 1 mm in some embodiments, at least 2 mm in some embodiments, no more than 5 mm in some embodiments, and no more than 10 mm in some embodiments. Nanostructured wavelength converting layer 12 includes, as described above, a nanostructured wavelength converting material 13 disposed in a matrix 14. The total thickness of nanostructured layer 12 may be at least 10 µm in some embodiments, at least 20 µm in some embodiments, no more than 200 µm in some embodiments, and no more than 2 mm in some embodiments.

Nanostructured wavelength converting layer 12 may be formed by, for example, one or more of the following processing techniques: dip-coating, spin-coating, drop-casting, inkjet printing, screen-printing, spray-coating, brushing, lamination, electro-deposition, vapor-deposition, extrusion, spinning, calendaring, thermoforming, casting and molding. For example, a nanostructured wavelength converting material may be mixed with a matrix such as a liquid organic polymer or silicone. The mixture may be disposed over dielectric material 18 using one of the methods listed above. Alternatively, the mixture may be disposed on a substrate such as a transparent plate or film that is then disposed over dielectric material 18. The film can be processed and/or cured using heat and/or UV and/or pressure in ambient or inert environment or a special environment as needed, to transform the liquid matrix material to a solid material in which the nanostructured particles are suspended. The film may be shaped or excess material may be removed by one or more processes such as cutting, trimming, polishing, mechanical fastening bonding, sealing welding, electroplating vacuum metalizing, printing, stamping or engraving. In some embodiments, nanostructured wavelength converting layer 12 is formed on a thin, transparent substrate that is then attached to dielectric material 18 before or after forming nanostructured wavelength converting layer 12 on the substrate.

Figure 3A:
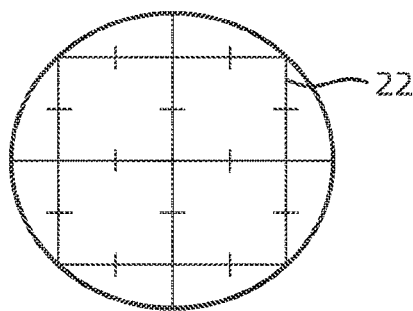
FIGS. 3A and 3B illustrate patterns of wire that may be used in a nanostructured wavelength converting material to dissipate heat.
Figure 3B:
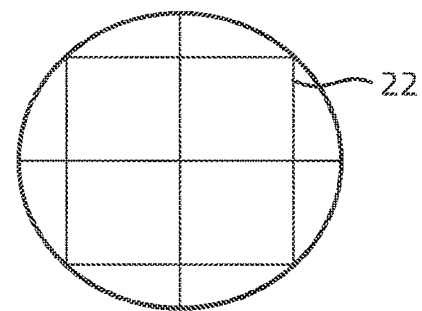

In some embodiments, in order to enhance dissipation of heat from the nanostructured wavelength converting layer, metallic or ceramic wires that conduct heat are formed on or in the nanostructured wavelength converting layer 12. The wires may be, for example, at least 1 µm wide in some embodiments, no more than 100 µm wide in some embodiments, no more than 1 mm wide in some embodiments, at least 1 µm thick in some embodiments, at least 10 µm thick in some embodiments, and no more than 100 µm thick in some embodiments. The wires may be spaced at least 1 mm apart in some embodiments, no more than 10 mm apart in some embodiments, and no more than 20 mm apart in some embodiments. The wires may be >90% reflective in some embodiments. The wires may be formed in the matrix layer 14 and may be, for example, random, parallel, or otherwise disposed in any suitable arrangement. Two examples of patterns for wires 22 are illustrated in FIGS. 3A and 3B. In some embodiments, wires 22 conduct heat to reflective container 20, which may act as a heat sink or may be thermally connected to a heat sink. The wires may be formed by, for example, screen printing, sputtering then lithographically patterning suitable material, or evaporating a suitable material through a shadow mask. Any suitable conductive material may be used for wires 22, including, for example, aluminum, copper, silver, and silver-coated copper.

In some embodiments, the space between nanostructured wavelength converting layer 12 and wavelength converting layer 16 is totally or partially filled with a dielectric material 18. Dielectric material 18 may be, for example, ambient gas, air, ceramic, alumina, polymer, or one or a combination of the above-described materials for the matrix of nanostructured wavelength converting layer 12. The materials of dielectric material 18 may be selected to conduct heat, or heat-conductive materials may be disposed within dielectric material 18. In some embodiments, one or more wires 22, described above in the text accompanying FIGS. 3A and 3B, may be embedded in dielectric material 18, instead of or in addition to wires disposed on or in nanostructured wavelength converting material 12.

Figure 4:
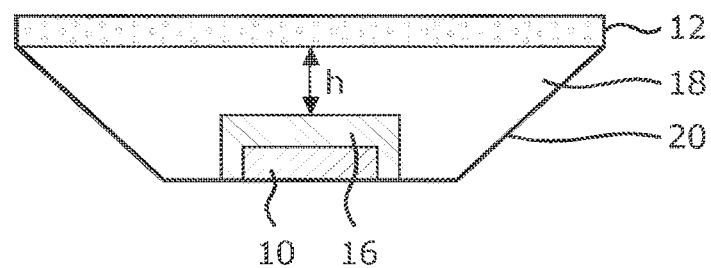
FIG. 4 illustrates a structure including an LED, a wavelength converting layer that extends over the sides of the LED, and a nanostructured wavelength converting material that is spaced apart from the LED.

In the device illustrated in FIG. 4, wavelength converting layer 16 extends over the sides of LED 10.

Figure 5:
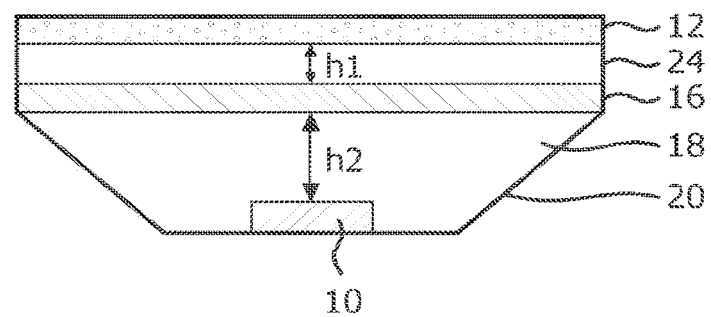
FIG. 5 illustrates a structure including a wavelength converting layer and a nanostructured wavelength converting layer that are both spaced apart from an LED.

FIG. 5 illustrates another example of a device including a nanostructured wavelength converting layer. The details of LED 10, nanostructured wavelength converting layer 12, wavelength converting layer 16, dielectric material 18, and reflective container 20 may be the same as described above. Both nanostructured wavelength converting layer 12 and wavelength converting layer 16 are spaced apart from LED 10. Wavelength converting layer 16 is disposed between LED 10 and nanostructured wavelength converting layer 12. Wavelength converting layer 16 is spaced from LED 10 a distance h2, which may be greater than 0 mm in some embodiments, at least 1 mm in some embodiments, no more than 10 mm in some embodiments, and no more than 20 mm in some embodiments. The space between wavelength converting layer 16 and LED 10 may be filled with a dielectric 18. Nanostructured wavelength converting layer 12 is spaced from wavelength converting layer 16 a distance h1, which may be greater than 0 mm in some embodiments, at least 1 mm in some embodiments, no more than 5 mm in some embodiments, and no more than 10 mm in some embodiments. The space between nanostructured wavelength converting layer 12 and wavelength converting layer 16 may be filled with dielectric 24, which may be any suitable dielectric material described above. Dielectric materials 18 and 24 may be different materials in some embodiments and the same material in some embodiments. The positions of nanostructured wavelength converting layer 12 and wavelength converting layer 16 may be switched in some embodiments such that nanostructured wavelength converting layer 12 is disposed between LED 10 and wavelength converting layer 16.

Figure 6:
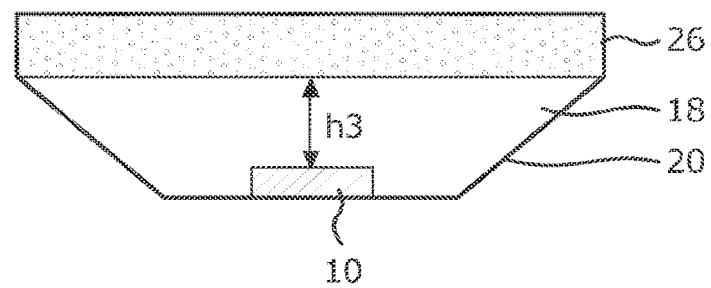
FIG. 6 illustrates a structure including an LED and a single wavelength converting region.

FIG. 6 illustrates another example of a device including a nanostructured wavelength converting material. The details of LED 10, dielectric material 18, and reflective container 20 may be the same as described above. The device illustrated in FIG. 6 has a single wavelength converting region 26. This region includes both a nanostructured wavelength converting material and a conventional wavelength converting material. In some embodiments, wavelength converting region 26 includes a nanostructured wavelength converting layer 12 and a wavelength converting layer 16, described above, formed layered on one another in contact with each other, with either layer on the top of the wavelength converting region 26. In some embodiments, wavelength converting region 26 includes a nanostructured wavelength converting material and an additional wavelength converting material mixed together. Such a mixed wavelength converting layer may be formed by any of the techniques described above, with any of the matrix material described above. Wavelength converting region 26 may be at least 20 µm thick in some embodiments, at least 50 µm thick in some embodiments, no more than 100 µm thick in some embodiments, and no more than 20 mm thick in some embodiments. Wavelength converting region 26 is spaced from LED 10 a distance h3, which may be greater than 0 mm in some embodiments, at least 1 mm in some embodiments, no more than 10 mm in some embodiments, and no more than 20 mm in some embodiments.

As described above, oxygen and moisture can adversely affect the performance of nanostructured wavelength converting materials. The nanostructured wavelength converting materials in the devices described above can be protected, for example, by selection of appropriate matrix materials, by forming a protective layer over the nanostructured wavelength converting layer, or by sealing the nanostructured wavelength converting layer.

In some embodiments, nanostructured wavelength converting materials 13 are embedded in matrix materials 14 with low oxygen and moisture permeability. For example, suitable low oxygen- and moisture-permeable materials include inorganic materials such as, for example, glass, ceramics, sol-gel-based titania, silica, alumina, zirconia, and zinc oxide. In addition, several polymers exhibit suitably low oxygen and moisture permeability. The following table 1 lists suitable materials and their oxygen and moisture permeability. Composites of suitable polymers and nanostructured wavelength converting materials may inhibit or reduce the moisture and oxygen penetration through the nanostructured wavelength converting layer. In some embodiments, the water vapor transmission rate is no more than $10^{-6}$ g/m$^2$/day and the oxygen transmission rate is no more than $10^{-3}$ cm$^3$/m$^2$/day/atm.

TABLE 1

List of some materials and their oxygen and moisture transmission rates.

| Material | Water vapor transmission rate (g/m$^2$/day) | Oxygen transmission rate (cm$^3$ · mm/m$^2$/day/atm) |
|---|---|---|
| Polyethylene | 1.2-5.9 | 70-550 |
| Polypropylene (PP) | 1.5-5.9 | 93-300 |
| Polystyrene (PS) | 7.9-4 | 200-540 |
| Polyethylene terephthalate (PET) | 3.9-17 | 1.8-7.7 |
| Poly(ethersulfone) (PES) | 14 | 0.04 |
| PEN | 7.3 | 3.0 |
| Polyimide | 0.4-21 | 0.04-17 |
| 15 nm Al/PET | 0.18 | 0.2-2.99 |
| SiO$_x$/PET | | 0.007-0.03 |
| ORMOCER (hybrid coating)/PET | | 0.07 |
| Parylene N | 0.59 | 15.4 |
| Parylene C | 0.08 | 2.8 |
| Parylene HT | 0.22 | 23.5 |
| Epoxy | 0.94 | 4 |
| Polyurethane | | 78.7 |
| Silicone | | 19685 |

Source: IEEE Journal of Selected Topics in Quantum Electronics, Vol. 10, No. 1, January 2004, p. 45.

In some embodiments, inorganic or organic materials are deposited on a nanostructured wavelength converting layer to reduce the oxygen and moisture penetration. For example, a coating of Al/alumina or SiO$_x$ or an organic-inorganic hybrid coating on polyethylene terephthalate (PET) may reduce both oxygen and moisture penetration through the nanostructured wavelength converting layer. Some suitable polymers such as parylene-based compounds can be vapor deposited and cross-linked at room temperature. In another example, alumina, silica, silicon nitride/oxynitride is deposited on the nanostructured wavelength converting layer to reduce the oxygen and moisture transmission rate through the nanostructured wavelength converting layer. Such coatings may be deposited by any suitable method including, for example, plasma enhanced chemical vapor deposition.

Figure 7:
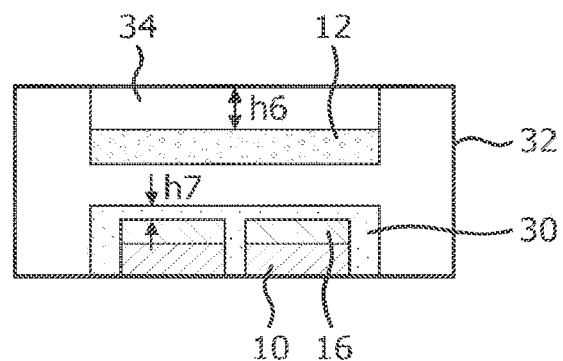
FIG. 7 illustrates a structure including a sealed nanostructured wavelength converting layer.

In some embodiments, a seal is formed around the nanostructured wavelength converting layer 12, as illustrated in FIG. 7. A dielectric layer 32 forms an enclosure around the bottom and sides of nanostructured wavelength converting layer 12. A dielectric layer 34 is disposed over the top of nanostructured wavelength converting layer 12 and seals the enclosure formed by dielectric layer 32. Dielectric layer 32 may be, for example, alumina, ceramic, or any other suitable material. Dielectric layer 34 may be, for example, alumina, glass or any other suitable material. The thickness h6 of dielectric layer 34 may be no more than 10 mm in some embodiments. The structure illustrated in FIG. 7 includes a wavelength converting layer 16, as described above, disposed over LED 10. A dielectric 30 may be disposed around LED 10 and wavelength converting layer 16. Dielectric 30 may be, for example, air, ceramic, polymer, or any other suitable material. The thickness h7 of dielectric 30 over wavelength converting layer 16 may be no more than 10 mm in some embodiments.

Figure 8:
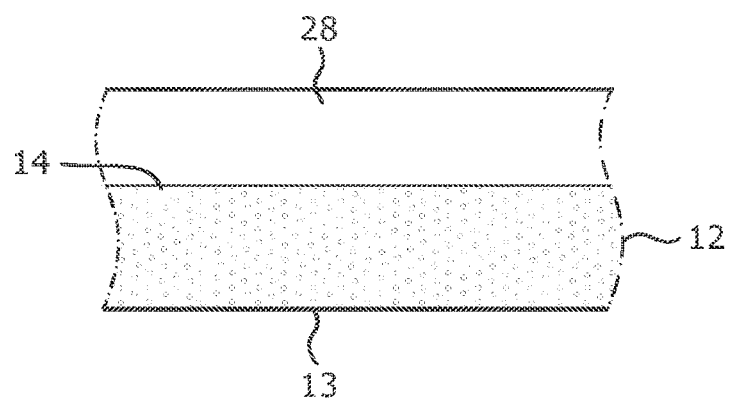
FIG. 8 illustrates a portion of a nanostructured wavelength converting layer and a reflector.

In some embodiments, a reflective layer 28 is disposed over nanostructured wavelength converting layer 12, as illustrated in FIG. 8. The thickness of a wavelength converting layer determines how much pump light is absorbed by the wavelength converting material. Scattering caused by some wavelength converting materials such as powder phosphors effectively increases the optical thickness of the wavelength converting layer. Nanostructured wavelength converting materials cause almost no scattering. As a result, a nanostructured wavelength converting material must be thicker than a wavelength converting layer including a scattering material. Thick layers are undesirable because they must dissipate more heat than thinner layers. Reflector 28 in FIG. 8 is configured to be more reflective of pump light, and less reflective of converted light. Pump light is therefore reflected back into nanostructured wavelength converting layer 12, where it may be converted, while converted light passes through reflector 28. Reflector 28 effectively doubles the optical thickness of nanostructured wavelength converting layer 12, allowing a thinner layer to be formed for a given amount of wavelength conversion. In some embodiments, reflector 28 is a dichroic stack.

Having described the invention in detail, those skilled in the art will appreciate that, given the present disclosure, modifications may be made to the invention without departing from the spirit of the inventive concept described herein. For example, though in the examples described above the light emitting device is a semiconductor device, in some embodiments other light emitting devices are used such as organic LEDs, high pressure UV arc lamps, or any other suitable light source. Therefore, it is not intended that the scope of the invention be limited to the specific embodiments illustrated and described.

The invention claimed is:

1. A structure comprising:
   a semiconductor light emitting device; and
   a wavelength converting region comprising:
      a nanostructured wavelength converting material configured to absorb pump light and emit converted light, the nanostructured wavelength converting material comprising particles having at least one dimension that is no more than 100 nm in length; and
      a transparent matrix in which the nanostructured wavelength converting material is disposed,
   a spacing between the wavelength converting region and the semiconductor light emitting device is greater than 0 nm and no more than 10 mm; and
   a phosphor, the phosphor disposed between the nanostructured wavelength converting material and the semiconductor light emitting device, the phosphor not in direct contact with the nanostructured wavelength converting material and not in direct contact with the semiconductor light emitting device.

2. The structure of claim 1 wherein the phosphor is garnet-based.

3. The structure of claim 1 wherein the nanostructured wavelength converting material is disposed in the transparent matrix material in a first layer, the phosphor is disposed in a second layer, and the first layer is not in direct contact with the second layer.

4. The structure of claim 1 wherein the transparent matrix is one of organic polymer and silicone.

5. The structure of claim 1 wherein the semiconductor light emitting device is disposed in a reflective container.

6. The structure of claim 1 wherein the nanostructured wavelength converting material is configured to emit red light.

7. The structure of claim 1 further comprising a dielectric material disposed between the wavelength converting region and the semiconductor light emitting device.

8. The structure of claim 1 further comprising at least one wire in direct contact with the wavelength converting region.

9. The structure of claim 8 wherein the at least one wire is thermally connected to a heat sink.

10. The structure of claim 1 further comprising a coating disposed on the wavelength converting region to reduce one of oxygen penetration and moisture penetration.

11. The structure of claim 10 wherein the coating is selected from the group consisting of alumina, silica, silicon nitride, and silicone oxynitride.

12. The structure of claim 10 wherein the coating is a parylene-based compound.

13. The structure of claim 1 wherein the nanostructured wavelength converting material further comprises a reflector configured to be more reflective of pump light and less reflective of converted light.

* * * * *